United States Patent
Choi et al.

(10) Patent No.: US 9,589,676 B2
(45) Date of Patent: Mar. 7, 2017

(54) SEMICONDUCTOR DEVICE AND OPERATING METHOD THEREOF

(71) Applicant: SK hynix Inc., Icheon-si, Gyeonggi-do (KR)

(72) Inventors: Jun-Gi Choi, Bucheon-si (KR); Tae-Kyun Kim, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 15/056,390

(22) Filed: Feb. 29, 2016

(65) Prior Publication Data
US 2017/0004890 A1 Jan. 5, 2017

(30) Foreign Application Priority Data
Jul. 2, 2015 (KR) ........................ 10-2015-0094512

(51) Int. Cl.
| G11C 29/04 | (2006.01) |
| G11C 29/00 | (2006.01) |
| G11C 11/419 | (2006.01) |
| G11C 7/22 | (2006.01) |

(52) U.S. Cl.
CPC ............. *G11C 29/78* (2013.01); *G11C 7/222* (2013.01); *G11C 11/419* (2013.01); *G11C 29/04* (2013.01)

(58) Field of Classification Search
CPC .................................................. G11C 29/04
USPC ........................................................ 365/201
See application file for complete search history.

(56) References Cited

U.S. PATENT DOCUMENTS

| 5,228,000 | A | * | 7/1993 | Yamagata | ............... | G11C 29/32 365/201 |
| 5,724,366 | A | * | 3/1998 | Furutani | ................. | G11C 29/40 365/201 |
| 5,903,575 | A | * | 5/1999 | Kikuda | ................... | G11C 29/24 365/201 |
| 6,904,552 | B2 | * | 6/2005 | Cowles | ................... | G11C 29/72 365/189.05 |
| 7,958,415 | B2 | * | 6/2011 | Ko | ...................... | G11C 29/1201 714/719 |
| 2010/0067312 | A1 | * | 3/2010 | Lee | ......................... | G11C 29/44 365/189.07 |
| 2010/0309734 | A1 | * | 12/2010 | Ehrenreich | .......... | G11C 16/349 365/189.07 |
| 2012/0113724 | A1 | * | 5/2012 | Sako | ................... | G11C 16/0483 365/185.22 |
| 2012/0173942 | A1 | * | 7/2012 | Do | ...................... | G11C 29/1201 714/731 |

FOREIGN PATENT DOCUMENTS

KR   1020120136674 A   12/2012

OTHER PUBLICATIONS

Bianca Schroeder et al., "DRAM Errors in the Wild: A Large-Scale Field Study," SIGMETRICS/Performance '09, Jun. 15-19, 2009, pp. 1-12, ACM.

* cited by examiner

*Primary Examiner* — Son Mai
(74) *Attorney, Agent, or Firm* — William Park & Associates Ltd.

(57) ABSTRACT

A semiconductor device may include: a first latch configured to store data outputted from a memory cell during a first operation; and a fail detection circuit configured to detect a fail by comparing the data outputted from the memory cell to the data stored in the first latch through a second operation performed at a predetermined time after the first operation.

20 Claims, 16 Drawing Sheets

SEMICONDUCTOR DEVICE AND OPERATING METHOD THEREOF

CROSS-REFERENCE TO RELATED APPLICATIONS

The present application claims priority of Korean Patent Application No. 10-2015-0094512, filed on Jul. 2, 2015, which is incorporated herein by reference in its entirety.

BACKGROUND

1. Field

Embodiments of the invention relate to a semiconductor device capable of detecting and correcting an intermittent fail which occurs in a memory cell, and an operating method thereof.

2. Description of the Related Art

With the increase in integration degree and the reduction in critical dimension (CD) of DRAM, a voltage difference for distinguishing the logical level of a cell has gradually decreased because the capacity of a cell capacitor becomes smaller than a bit line capacitor.

When a cell with a small capacity is connected to a sense amplifier, a one-bit fail is highly likely to occur during the operation of the cell. Such a one-bit fail is referred to as an intermittent tWR fail (hereafter, referred to as an intermittent fail).

The intermittent fail does not continuously occur in a specific cell, but irregularly occurs. Thus, when the cell is repaired, the following problem may occur.

In the case of DRAM, a refresh operation is performed at a predetermined cycle, but an intermittent fail may occur between the refresh cycles. Thus, such a problem cannot be solved through a typical refresh operation.

Therefore, there is a demand for a semiconductor device for correcting an intermittent fail during the operation of a memory cell in order to increase the reliability of the memory cell, and an operating method thereof.

SUMMARY

In an embodiment, a semiconductor device may include a first latch configured to store data outputted from a memory cell during a first operation. The semiconductor device may also include a fail detection circuit configured to detect a fail by comparing the data outputted from the memory cell to the data stored in the first latch through a second operation performed at a predetermined time after the first operation.

In an embodiment, an operating method of a semiconductor device may include a first step of performing a first operation to latch first data outputted from a memory cell. The operating method may also include a second step of performing a second operation when a predetermined time elapses after the first operation, and detecting a fail by comparing second data outputted from the memory cell to the first data.

In an embodiment, a semiconductor device includes a first latch configured to store data that is outputted from a memory cell. The semiconductor device also includes a fail detection circuit configured to determine if a fail has occurred by comparing the data stored in the first latch to data outputted from an amplifier.

The fail detection circuit may output a bank fail signal to indicate when an intermittent fail has occurred in a corresponding bank. A signal stored in the first latch may be stored where an intermittent fail occurred when the fail is detected. The fail detection circuit may output a bit-fail signal. The bit-fail signal may indicate whether an intermittent fail has occurred. The fail detection circuit may include a bit fail detector and a bank fail detector. The bit fail signal may be activated when the fail is detected. The bit fail signal may be deactivated when the fail is not detected. The semiconductor device may further comprise a write driver configured to output a signal stored in the first latch when the bit fail signal is activated. The bit fail signal may be activated when the fail is detected. The bit fail signal may be deactivated when the fail is not detected. The semiconductor device may further comprise a write driver configured to output signal stored in the first latch when the bit fail signal is activated. The bit fail signal may indicate whether two bit data are equal. The bank fail detector may be configured to output the bank fail signal in response to an operation on group fail signals.

DETAILED DESCRIPTION

Figure 1:
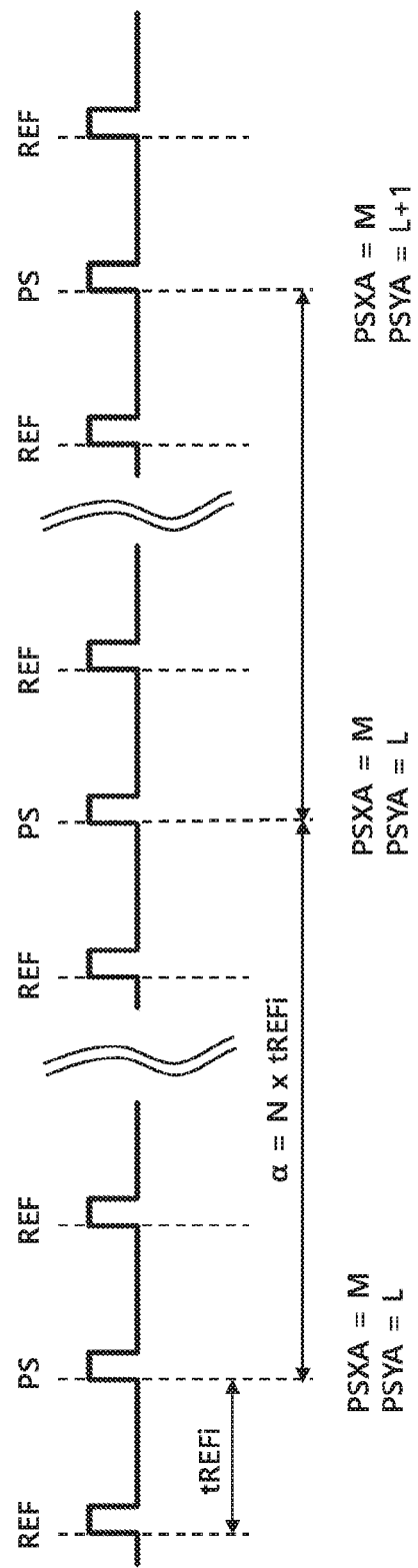
FIG. 1 is a timing diagram illustrating the operation of a memory device in accordance with an embodiment of the invention.

Various embodiments will be described below in more detail with reference to the accompanying figures. The invention may, however, be embodied in different forms and should not be construed as limited to the embodiments set forth herein. Rather, these embodiments are provided so that this disclosure will be thorough and complete, and will fully convey the scope of the invention to those skilled in the art. Throughout the disclosure, like reference numerals refer to like parts throughout the various figures and embodiments of the invention. Various embodiments are directed to a semiconductor device capable of detecting and correcting an intermittent fail during operation of a memory cell, and an operating method thereof. In addition, various embodiments are directed to a semiconductor device capable of repairing a cell in which an intermittent fail occurred during operation of a memory cell, and an operating method thereof. As will be explained, the semiconductor device may further include a write driver configured to store the data stored in the first latch into the memory cell, when a fail is detected in the memory cell. Further, as will be explained below, the operating method may further include a third step of storing the first data in the memory cell when the fail is detected at the second step.

In order to detect an intermittent fail in a memory cell, a semiconductor device in accordance with an embodiment of the invention reads the same memory cell two or more times at each predetermined cycle, compares the read results, and determines whether an intermittent fail occurred in the memory cell.

Hereafter, an operation of reading cell data at each predetermined cycle to detect an intermittent fail is referred to as a patrol scrubbing (PS) operation.

To determine whether an intermittent fail occurred in one cell, the cell needs to be read two or more times. In the following disclosure, it may assumed that the data of the cell are read two times.

Furthermore, a first read operation for one cell is referred to as a first PS operation, and a second read operation for the cell is referred to as a second PS operation. The first PS operation may be abbreviated to a first operation, and the second PS operation may be abbreviated to a second operation. The first operation may be performed again when a write operation is performed before the second operation.

In the following disclosure, it may be assumed that a memory cell is a DRAM cell. Furthermore, it may be assumed that the refresh cycle of DRAM is referred to in order to determine a predetermined cycle.

Although DRAM is taken as an example for description in the following disclosure, the technical idea of the invention may be applied to other types of memory cells in which an intermittent fail occurs.

Furthermore, it may be assumed that a semiconductor device exists in the same chip or die as a memory cell or exists in a different chip or die from the memory cell.

Referring to FIG. 1, a timing diagram illustrating an example in which a memory device in accordance with an embodiment of the p invention performs a PS operation by referring to the refresh cycle of DRAM.

DRAM refreshes the entire rows at each refresh cycle tREF.

The unit refresh cycle tREFi of the unit refresh operation which is performed at each row may be determined by dividing the refresh cycle tREF by the number of rows.

For example, when the number of rows is 8K(=8192), the refresh cycle tREF is 64 ms. Thus, the unit refresh cycle tREFi becomes about 7.8 us.

In FIG. 1, REF represents the point of time that the unit refresh operation is performed. Further, PS represents the point of time that the PS operation is performed.

In an embodiment, the cycle a of the PS operation corresponds to N unit refresh operation times (N×tREFi), as illustrated in FIG. 1.

In order to detect an intermittent fail for one cell, two PS operations are needed.

Thus, two PS operations are performed on the same address (M, L), and then performed on the next address (M, L+1).

In FIG. 1, when the next address is determined, the column address is increased by one before the row address. In an embodiment, the row address may be increased by one before the column address.

Figure 2:
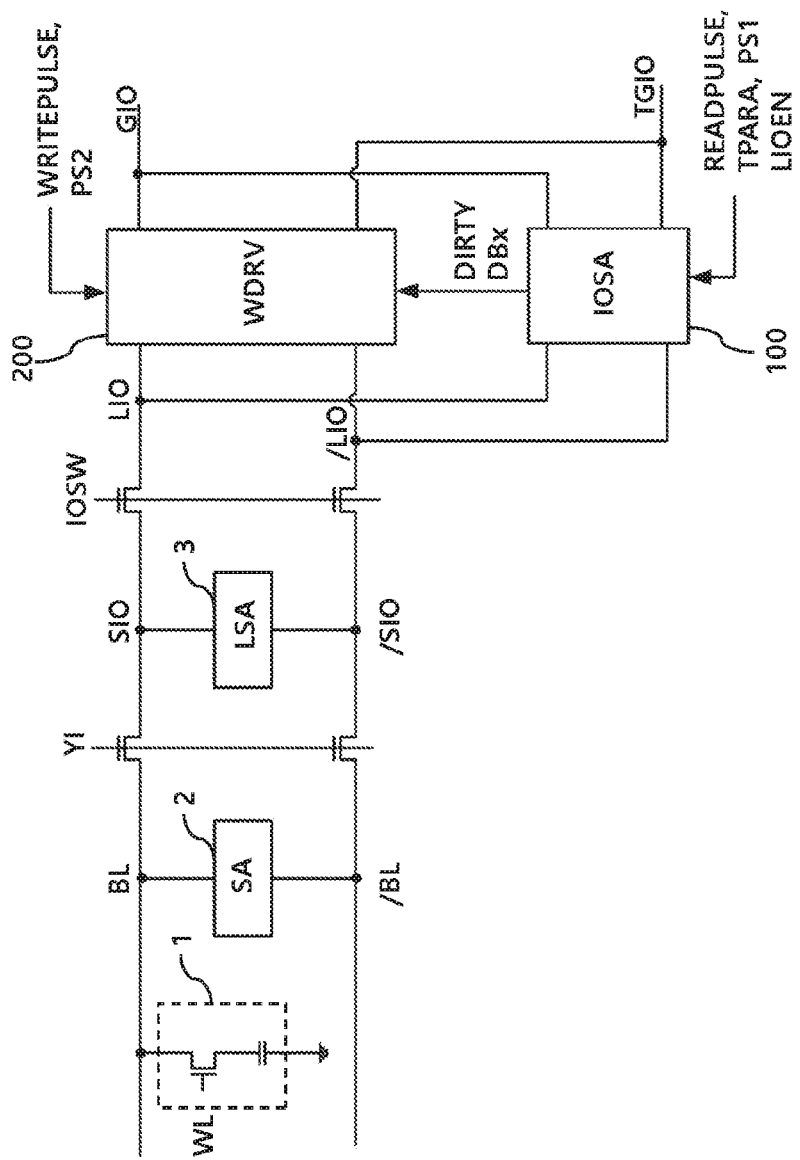
FIG. 2 is a circuit diagram illustrating a data path of the semiconductor device in accordance with an embodiment of the invention.

Referring to FIG. 2, a circuit diagram illustrating a data path of the semiconductor device in accordance with an embodiment of the invention is described. Moreover, the internal components of the semiconductor device may be configured as circuits or the like.

A cell 1 is selected by a bit line BL and a word line WL. Further, data of the cell 1 is amplified by a sense amplifier 2 and forms a bit line (BL or /BL) voltage.

The bit line signal is applied to a sense amplifier input/output line SIO or /SIO by a column select signal YI, and a local sense amplifier (LSA) 3 amplifies the bit line signal.

The voltage of the sense amplifier input/output line SIO or /SIO is applied to a local input/output line LIO by an input/output switch signal IOSW.

Figure 3:
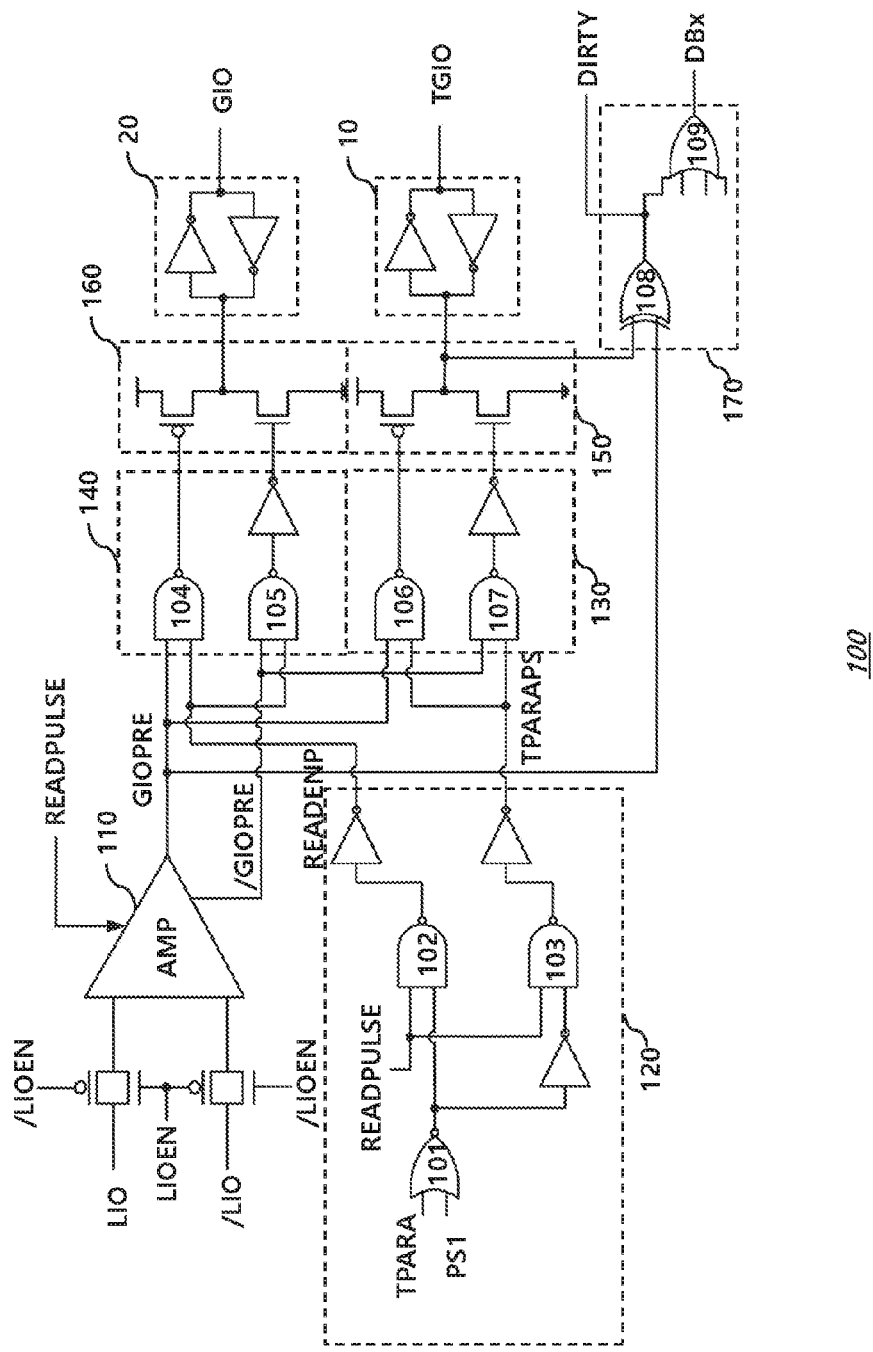
FIG. 3 is a circuit diagram of an input/output sense amplifier (IOSA) of FIG. 2.

An input/output sense amplifier (IOSA) 100 amplifies the signal of the local input/output line LIO or /LIO according to a read pulse signal READPULSE, a parallel test signal TPARA, a first PS signal PS1, and an LIO enable signal LIOEN; and provides the amplified signal to a global input/output line GIO and a test global input/output line TGIO. FIG. 3 also illustrates LIO enable signal /LIOEN.

The IOSA 100 generates a bit fail signal DIRTY and a bank fail signal DBx, and provides the generated signals to a write driver 200. The bit fail signal DIRTY and the bank fail signal DBx indicate whether an intermittent fail was detected.

The write driver 200 corrects data of a cell in which an intermittent fail occurred by referring to the write pulse WRITEPULSE, the second PS signal PS2, the bit fail signal DIRTY, and the bank fail signal DBx.

Hereafter, the operations of the IOSA 100 and the write driver 200 and the meanings of the respective signals will be described in more detail.

Referring to FIG. 3, a circuit diagram of the input/output sense amplifier of FIG. 2 is described.

The IOSA 100 includes an amplifier 110, a first latch 10, a second latch 20, a PS control unit 120, a first driving control unit 130, a second driving control unit 140, a first driving unit 150, a second driving unit 160, and a fail detection unit 170.

The amplifier 110 receives signals of the local input/output lines LIO and /LIO according to the local input/output line enable signal LIOEN. The amplifier 110 also amplifies the received signals to output pre-global signals GIOPRE and /GIOPRE.

The first driving unit 150 generates a test global input/output signal TGIO according to control of the first driving control unit 130.

The first latch 10 latches the test global input/output line TGIO.

The first driving control unit 130 controls the first driving unit 150 according to the outputs of the amplifier 110 and the PS control unit 120.

The second driving unit 160 generates a global input/output signal GIO according to control of the second driving control unit 140.

The second latch 20 latches the signal of the global input/output line GIO.

The second driving control unit 140 controls the second driving unit 160 according to the outputs of the amplifier 110 and the PS control unit 120.

The PS control unit 120 controls the first and second driving control units 130 and 140 to store the output of the amplifier 110 in the first latch 10 during the first PS operation; and controls the first and second driving control units 130 and 140 to store the output of the amplifier 110 in the second latch 20 when the first PS operation is not performed.

In an embodiment, the PS control unit 120 may control the first and second driving control units 130 and 140 to store a test value acquired from the output of the amplifier 110 in the first latch 10 during a parallel test operation. The PS control unit 120 may control the first and second driving control units 130 and 140 to store the output of the amplifier 110 in the second latch 20 during a general read operation.

Since the parallel test operation is publicly known, the descriptions thereof are omitted herein.

During the first PS operation, the first PS signal PS1 becomes high, and an output of a NOR gate 101 becomes low. Then, an output of a NAND gate 103 is controlled according to the read pulse signal READPULSE, and an output of a NAND gate 102 becomes low.

Thus, an output of a NAND gate 104 of the second driving control unit 140 becomes high, and an output of a NAND gate 105 becomes low. Then, an output of the second driving unit 160 is floated. NAND gates 106 and 107 are also illustrated.

Furthermore, when the read pulse signal READPULSE is low, the output of the first driving unit 150 is floated. However, when the read pulse signal READPULSE is high, the output of the first driving unit 150 has the same logical level as the output GIOPRE of the amplifier 110. Thus, the output GIOPRE of the amplifier 110 is stored in the first latch 10.

The fail detection unit 170 compares the data read during the first PS operation, that is, the data stored in the first latch 10 to the data read during the second PS operation, that is, the data GIOPRE outputted from the amplifier 110 during the second PS operation.

An XOR gate 108 outputs a bit-fail signal. The bit fail signal has a low level when two bit data are equal to each other or when it is considered that an intermittent fail did not occurred; and has a high level when two bit data are different from each other or when it is considered that an intermittent fail occurred.

When a high-level signal is outputted from one or more of all XOR gates 108 in a bank, an OR gate 109 of the fail detection unit 170 outputs a bank fail signal DBx at a high level to indicate that an intermittent fail occurred in the corresponding bank, where x represents a bank number.

The XOR gate 108 may be referred to as a bit fail detector. Further, the OR gate 109 may be referred to as a bank fail detector.

Figure 4:
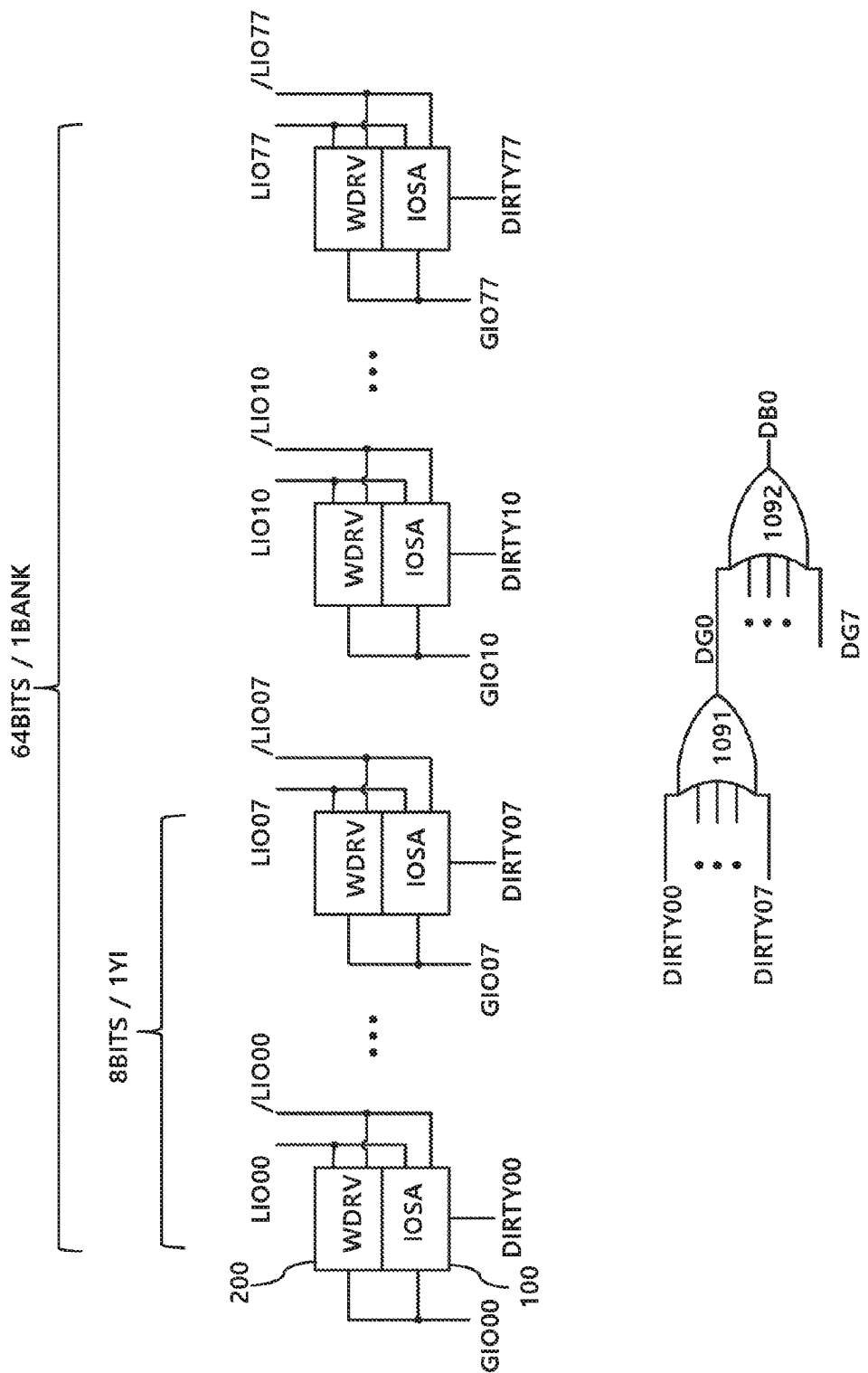
FIG. 4 is a circuit diagram of a bank fail detector of FIG. 3.

Referring to FIG. 4, a circuit diagram for describing the operation of the bank fail detector 109 is illustrated. FIG. 4 illustrates global input/output lines GIO00 to GIO77, local input/output lines LIO00 to LIO77 and /LIO00 to /LIO77.

In FIG. 4, bit fail signals for the respective bits are represented by DIRTY00 to DIRTY07 and DIRTY10 to DIRTY77.

The second number behind DIRTY represents a bit number, and the first number behind DIRTY represents the group number for bits which are processed together by the OR gate 1091; and is associated with column signals which are outputted at the same time by one column select signal.

FIG. 4 illustrates the case in which the total number of bits included in a bank is 64, eight bits are included in one group, and total eight groups are included in the bank.

The OR gate 1091 outputs a group fail signal DGx (DG0 and DG7), and the OR gate 1092 performs an operation on the group fail signals DGx outputted from the respective groups and outputs the bank fail signal DBx (DB0).

Figure 5:
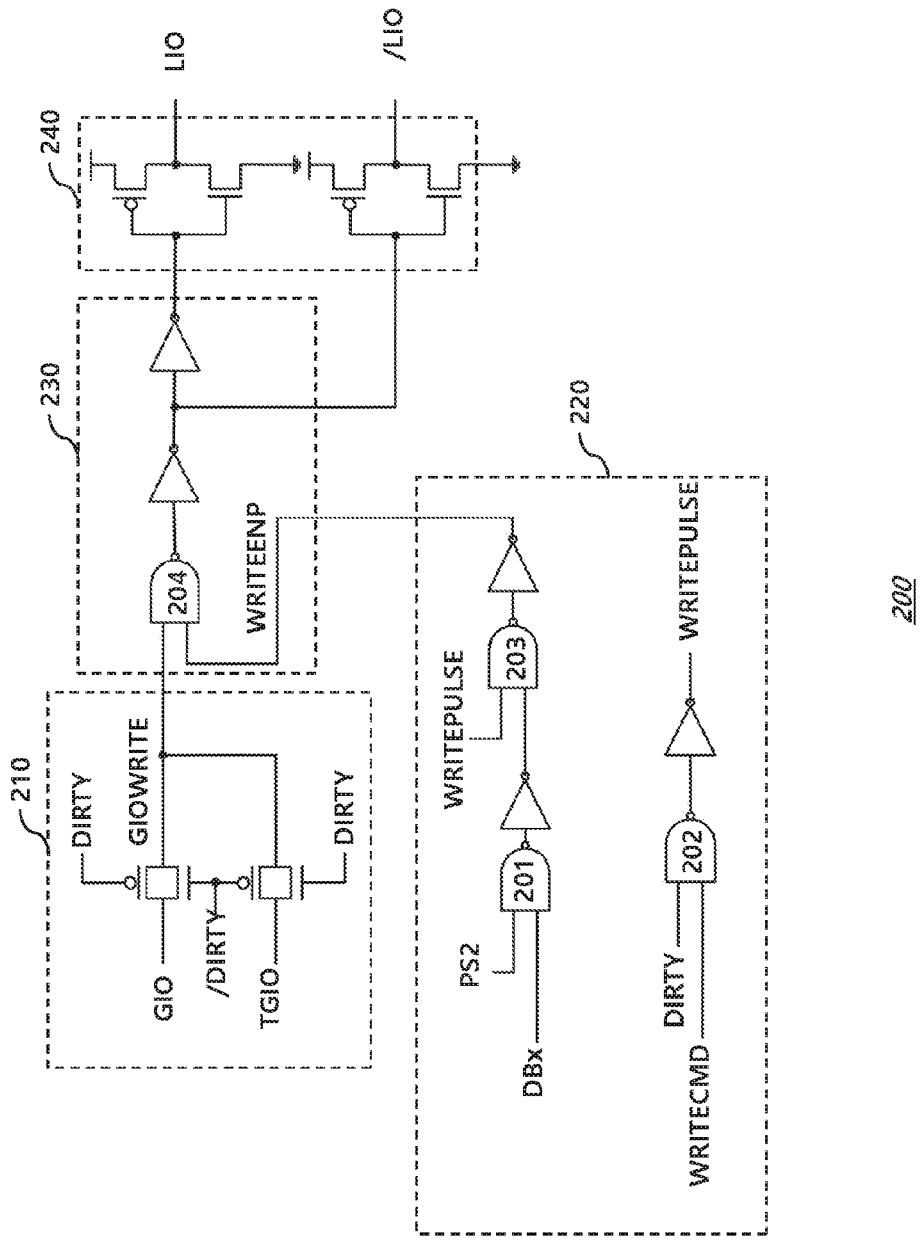
FIG. 5 is a circuit diagram of a write driver of FIG. 2.

Referring to FIG. 5, a circuit diagram of the write driver 200 of FIG. 2 is illustrated.

The write driver 200 includes a signal selection unit 210, a restoring control unit 220, a third driving control unit 230, and a third driving unit 240.

The bit fail signal DIRTY is activated when a fail is detected during the second PS operation. The bit fail signal DIRTY is deactivated during a general write operation and when no fail is detected during the second PS operation. FIG. 5 also illustrates bit fail signal /DIRTY.

Since the general write operation is publicly known, the detailed descriptions thereof are omitted herein.

In an embodiment, when a fail is detected, the signal TGIO stored in the first latch 10 during the first PS operation is stored in a cell in which an intermittent fail occurred in order to correct the intermittent fail.

Thus, the signal selection unit 210 selects the output TGIO of the first latch 10 when the bit fail signal DIRTY is activated. Otherwise, the signal selection unit 210 selects the output GIO of the second latch 20.

In the restoring control unit 220, a NAND gate 201 outputs a low-level signal to prepare a write operation, when the bank fail signal DBx and the second PS signal PS2 are activated.

When a write command WRITECMD and the bit fail signal DIRTY are activated, a NAND gate 202 outputs a low level to set the write pulse signal WRITEPULSE at a high level.

When both of the NAND gates 201 and 202 output a low-level signal, a NAND gate 203 outputs a low-level signal and the restoring control unit 220 outputs a high-level signal WRITEENP to prepare a write operation of the third driving control unit 230.

The third driving control unit 230 controls the third driving unit 240 to provide a low-level signal to the local input/output line LIO when the output of the restoring control unit 220 is low. The third driving control unit 230 controls the output GIOWRITE of the signal selection unit 210 to be outputted from the local input/output line LIO when the output of the restoring control unit 220 is high.

Figure 6:
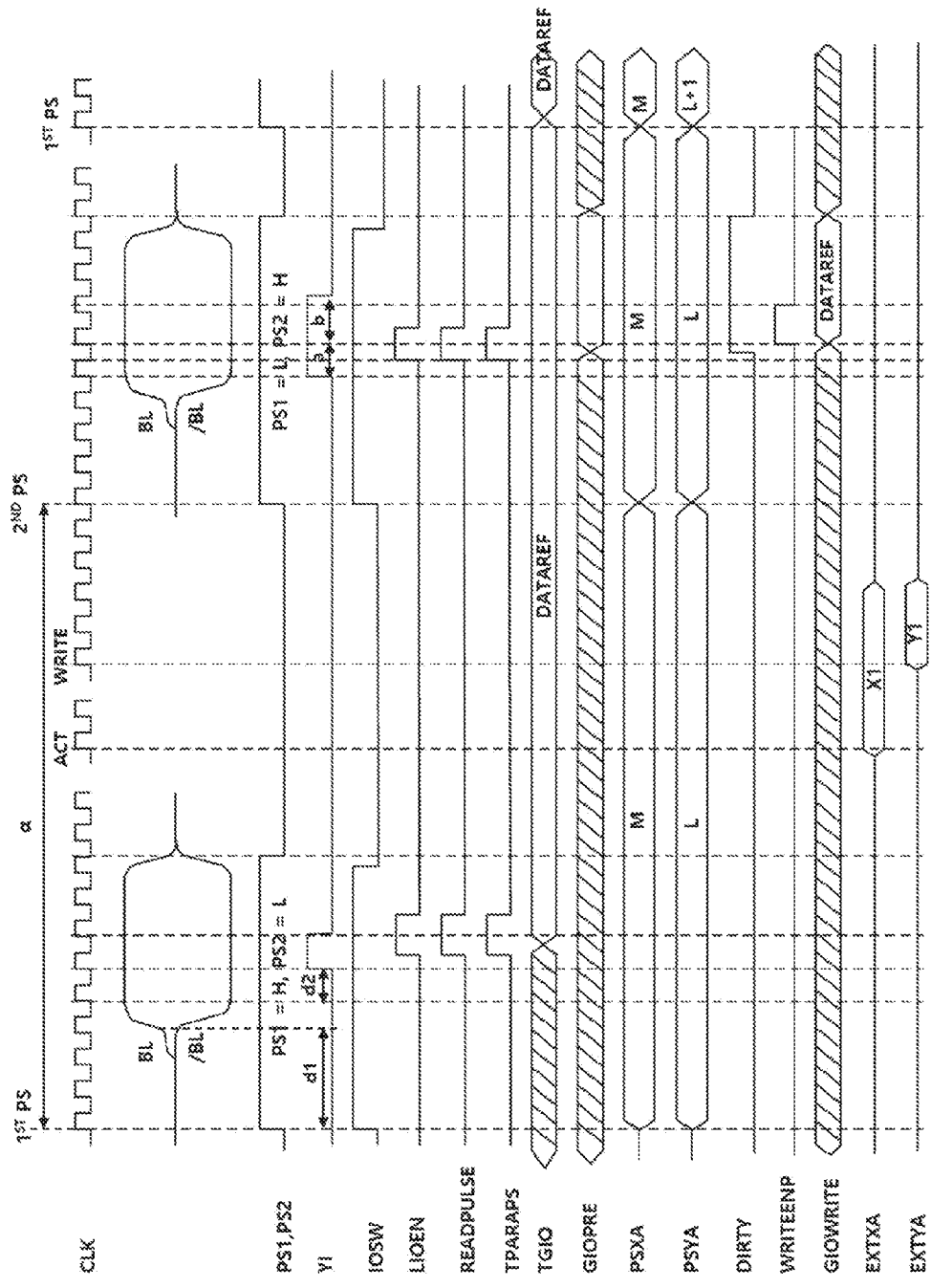
FIG. 6 is a timing diagram illustrating the operation of the semiconductor device in accordance with an embodiment of the invention.

Referring to FIG. 6, a timing diagram illustrating the operation of the semiconductor device in accordance with an embodiment of the invention is described. FIG. 6 also illustrates a clock signal CLK.

In an embodiment, the first and second PS operations are performed on a row address M and a column address L.

Between the point of time that the first PS operation is started and the point of time that the second PS operation is started, a time difference α exists as illustrated in FIG. 1.

In FIG. 1, an active operation ACT and a write operation WRITE between the first and second PS operations indicate write operations on a cell of which the row address and column address are X1 and Y1.

At this time, it may be assumed that the row address X1 and the column address Y1 are different from the row address M and the column address L of the cell in which the PS operation is performed.

In FIG. 6, a hatched part indicates that any data are okay.

During the first PS operation, the first PS signal PS1 is activated, and during the second PS operation, the second PS signal PS2 is activated.

In FIG. 6, d1 represents a sense amplifier margin. In an embodiment, during the first PS operation, the column select signal YI may be activated later by d2 than in a general write operation. Through this operation, the data of the cell corresponding to the PS target can be more stably read.

Then, as the local input/output line enable signal LIOEN, the input/output switch signal IOSW, and the read pulse signal READPULSE are activated, a first driving control unit enable signal TPARAPS is activated to enable the first driving control unit 130.

Thus, data DATAREF outputted through the first PS operation are stored in the first latch 10.

Since the row address (EXTXA) X1 and the column address (EXTYA) Y1 at which the write operation is performed are different from the row address M and the column address L of the cell in which the PS operation is performed, the next PS operation becomes the second PS operation.

Since the row address X1 and the column address Y1 at which the write operation is performed are equal to the row address M and the column address L of the cell in which the PS operation is performed, the next PS operation becomes the first PS operation. This configuration will be described with reference to FIG. 7.

During the second PS operation, the column select signal YI is provided without the additional margin d2, unlike the first PS operation.

In FIG. 6, 'a' indicates a period in which the column select signal is activated to read data during the second PS operation. Further, 'b' indicates a period in which the column select signal is activated to restore data when a bit fail is detected.

As the local input/output line enable signal LIOEN and the input/output switch signal IOW are activated, the output GIOPRE of the amplifier 110 is provided.

In FIG. 3, the fail detection unit 170 compares the output GIOPRE of the amplifier 110 and the output of the first latch 10, and detects whether an intermittent fail occurred.

In an embodiment, it is assumed that the bit fail signal DIRTY is activated because an intermittent fail occurred.

At this time, according to the operation of the write driver 200 of FIG. 4, the signal stored in the first latch 10 is selected by the signal selection unit 210; and the signal GIOWRITE outputted from the signal selection unit 210 is provided to the local input/output line LIO.

When the data read during the first PS operation and the data read during the second PS operation are different from each other, it is considered that an intermittent fail occurred in the corresponding cell. Further, the data read during the first PS operation is used to correct the data of the corresponding cell.

When the first and second PS operations are ended, the first PS operation is performed on the next cell after a predetermined time α.

In an embodiment, the column address is increased by one in order to select the next cell.

Figure 7:
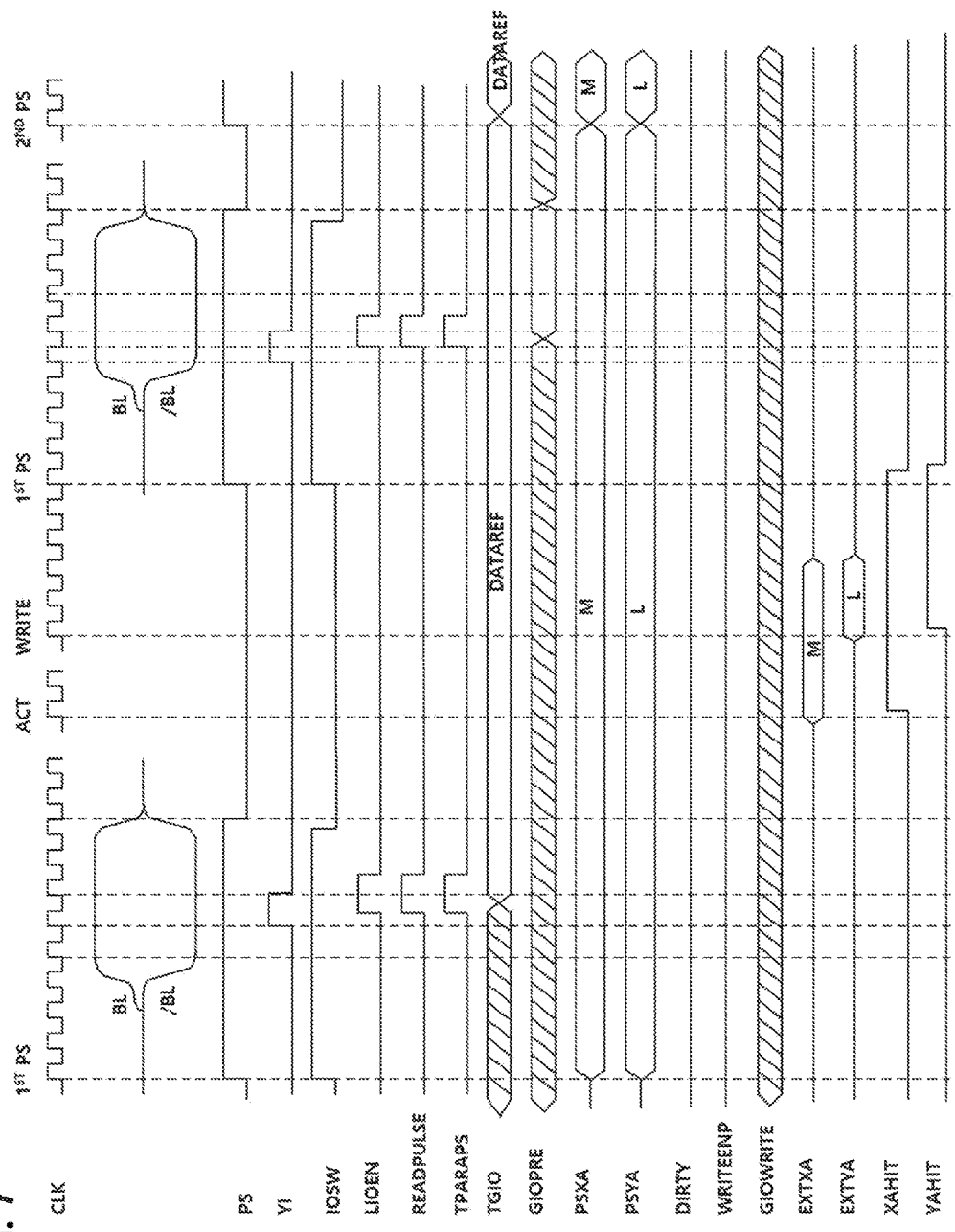
FIG. 7 is a timing diagram illustrating the operation of the semiconductor device in accordance with an embodiment of the invention.

Referring to FIG. 7, a timing diagram illustrating the operation of the semiconductor device in accordance with an embodiment of the invention is illustrated.

As described above, FIG. 6 illustrates the case in which an address corresponding to a write request (hereafter, referred to as a write request address) after the first PS operation is different from the address of a cell corresponding to the target of the first PS operation.

However, FIG. 7 illustrates the case in which a write request address after the first PS operation is equal to the address of the cell in which the first PS operation is performed.

In an embodiment, since the data of the corresponding cell are updated after the first PS operation, the first PS operation is performed again on the same cell.

In FIG. 7, XAHIT represents whether the row address (PSXA, M) of a cell in which the PS operation is performed is equal to the row address EXTXA of a cell corresponding to a write request (hereafter, referred to as a write request cell); and YAHIT represents whether the column address (PSYA, L) of the cell in which the PS operation is performed is equal to the column address EXTYA of the write request cell.

Figure 8:
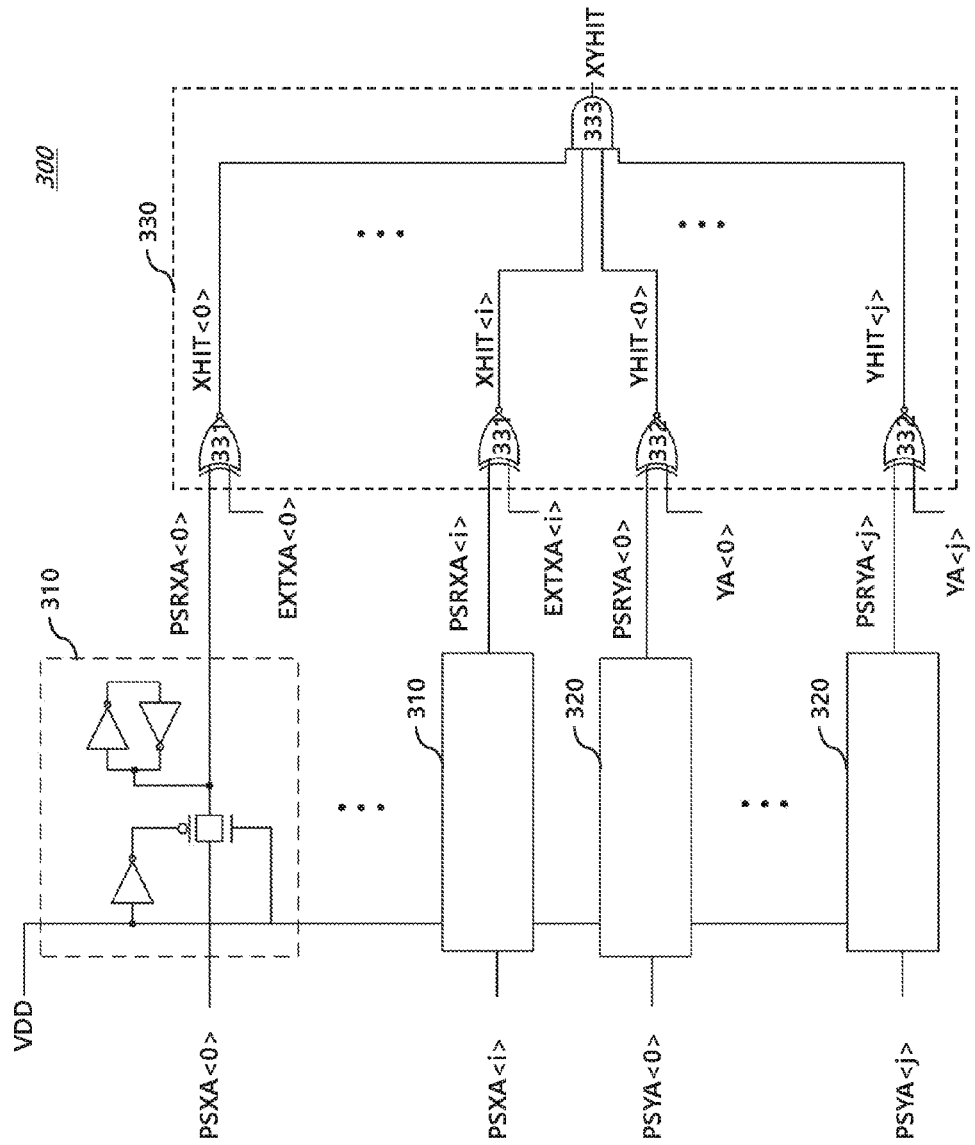
FIG. 8 is a circuit diagram illustrating an address comparator of the semiconductor device in accordance with an embodiment of the invention.

Referring to FIG. 8, a circuit diagram illustrating an address comparator 300 of the semiconductor device in accordance with an embodiment of the invention is described. FIG. 8 illustrates a power supply voltage VDD, latched addresses PSRXA$<j>$, PSRYA$<j>$, row addresses EXTXA $<0:i>$ The address comparator 300 performs an operation of comparing the address of a cell in which the PS operation is performed to the address of a write request cell.

The address comparator 300 includes a row address latch unit 310 and a column address latch unit 320. The row address latch unit 310 latches the row address of the cell in which the PS operation is performed. Further, the column address latch unit 320 latches the column address of the cell in which the PS operation is performed.

The address comparator 300 further includes a determination unit 330 which compares an output of the row address latch unit 310 to the row address of the write request cell; and compares an output of the column address latch unit 320 to the column address of the write request cell to determine whether the addresses coincide with each other after a fail is detected. In an embodiment, the first PS operation may be performed again on a memory cell when an output of the address comparator 300 is activated.

The determination unit 330 includes an XOR gate 331 for comparing row addresses, an XOR gate 332 for comparing column addresses, and an AND gate 333 for performing an AND operation on outputs of the XOR gates 331 and 332 which output XHIT$<0:i>$ and YHIT$<0:j>$, with the AND gate 333 outputting XYHIT. The XOR gates 331 and 332 are inputted with EXTXA$<i>$ and YA$<0:j>$ respectively Referring to FIG. 9, a flowchart illustrating the operation of the semiconductor device in accordance with an embodiment of the invention is described.

Figure 9:
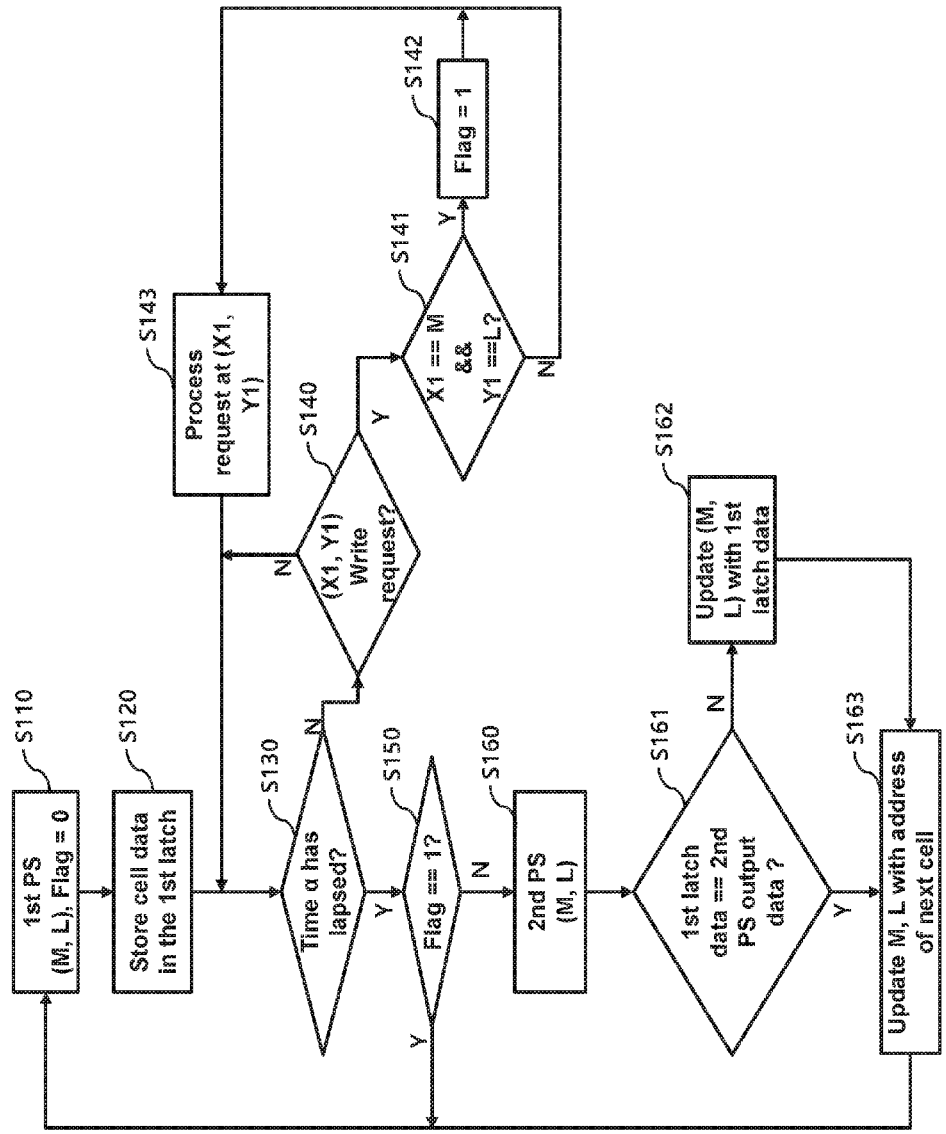
FIG. 9 is a flowchart illustrating the operation of the semiconductor device in accordance with an embodiment of the invention.

The flowchart of FIG. 9 corresponds to the waveform diagrams of FIGS. 6 and 7.

First, the semiconductor device starts the first PS operation on a cell of which the row address and column address are M and L, at step S110. At this time, a flag is set to zero.

The semiconductor device stores data read through the first PS operation in the first latch 10 at step S120.

Then, the semiconductor device determines whether a predetermined time α has elapsed, at step S130.

When it is determined that the predetermined time has elapsed, the semiconductor device determines whether the flag is 1, at step S150. The flag indicates whether a write request has been made for the same address as the address at which a PS operation is performed after the first PS operation.

When the flag is 1, the semiconductor device performs the first PS operation again on the corresponding cell at step S110, and when the flag is 0, the semiconductor device performs the second PS operation on the same cell at step S160.

Then, the semiconductor device determines whether the data read through the second PS operation are equal to the data stored in the first latch 10, at step S161.

When the two data are different from each other, the semiconductor device determines that an intermittent fail occurred, and updates the data of the cell in which the PS operation was performed using the data stored in the first latch 10, at step S162.

Then, the semiconductor device updates the row and column addresses M and L into the address of the next cell at which the PS operation is to be performed, at step S163, and performs the first PS operation on the next cell at step S110.

At steps S140 to S142, the semiconductor device determines whether a write request has been made for a cell in which the PS operation is performed, before the second PS operation is performed after the first PS operation.

First, the semiconductor device determines whether a write request has been made at step S140.

When it is determined that no write request has been made, the semiconductor device proceeds to step S130. When it is determined that a write request has been made, the semiconductor device determines whether the write request address (X1, Y1) is equal to the address (M, L) of the cell in which the PS operation is performed.

When it is determined that the write request address (X1, Y1) is equal to the address (M, L) of the cell in which the PS operation is performed, the flag is set to 1. Further, when it is determined that the write request address (X1, Y1) is different from the address (M, L) of the cell in which the PS operation is performed, the flag is not changed. Then, the semiconductor device processes the write request on the write request address (X1, Y1) at step S143, and proceeds to step S130.

Figure 10:
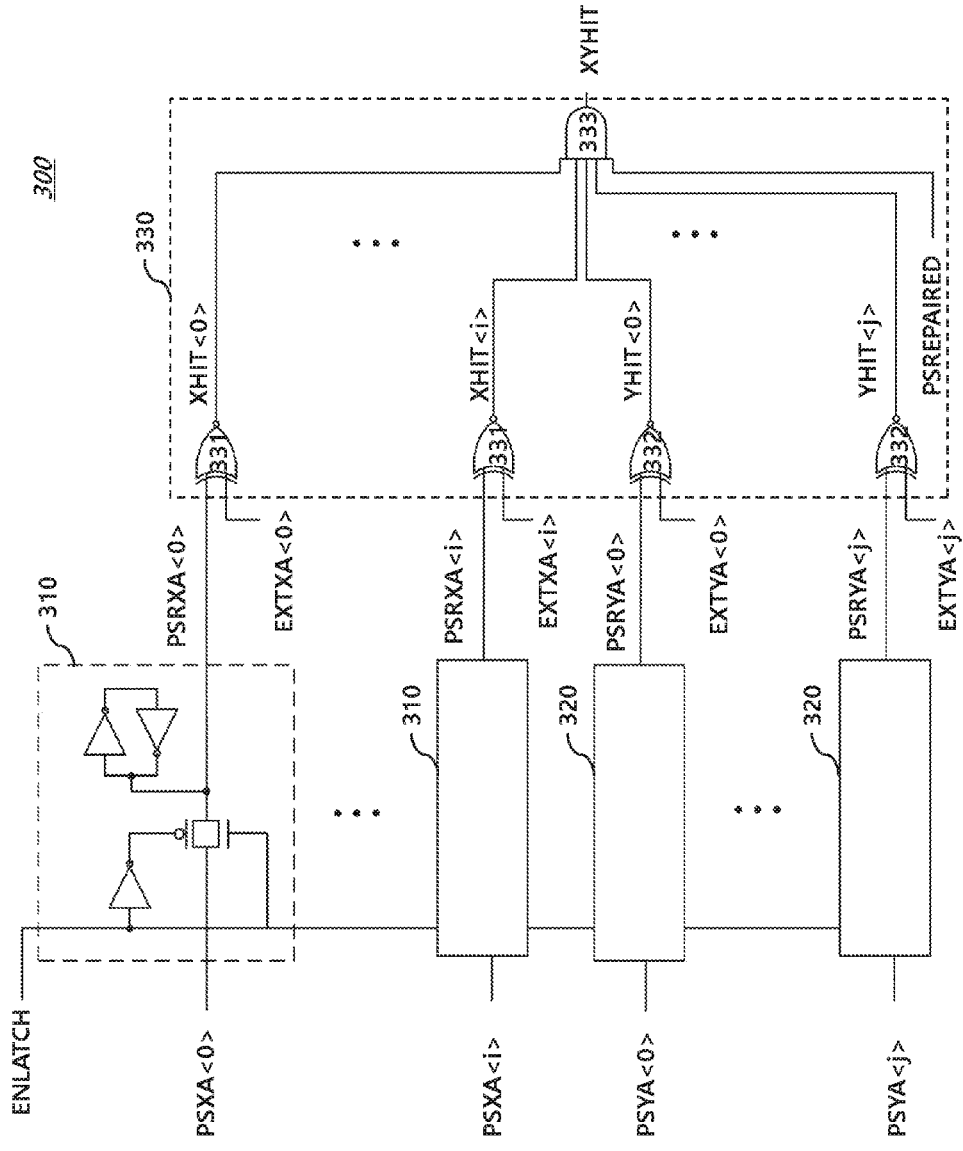
FIG. 10 is a circuit diagram illustrating an embodiment of the address comparator.

Referring to FIG. 10, a circuit diagram illustrating an embodiment of the address comparator 300 is described.

The embodiment of FIG. 10 is different from the embodiment of FIG. 8 in that the row address latch unit 310 and the column address latch unit 320 latch a PS address according to a latch enable signal ENLATCH. FIG. 10 also illustrates column addresses EXTYA <0:j>.

In the embodiment of FIG. 10, an AND gate 333 performs an AND operation on outputs of XOR gates 331 and 332 and a PS repair signal PSREPAIRED; and checks whether the PS address is equal to a write request address according to the operation result.

Figure 11:
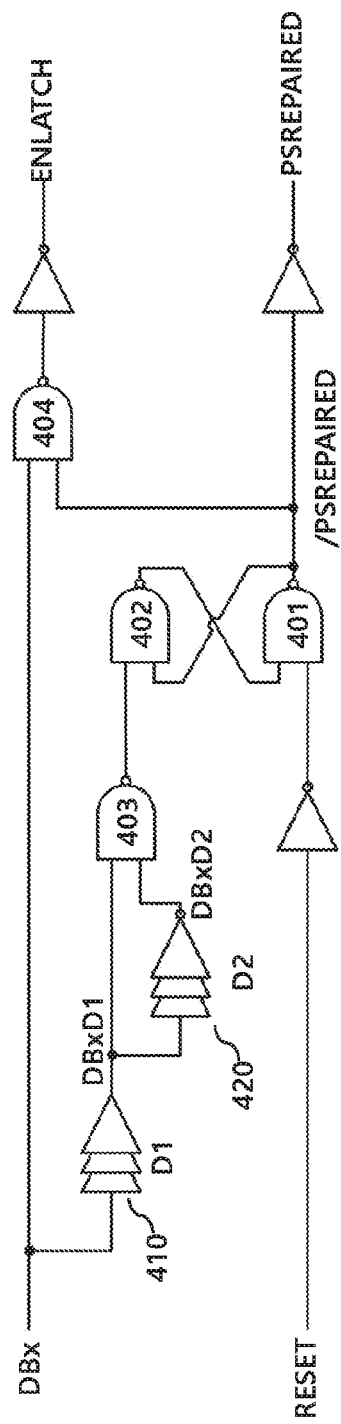
FIG. 11 is a diagram illustrating a control signal generation circuit for controlling the address comparator of FIG. 10.
Figure 12:
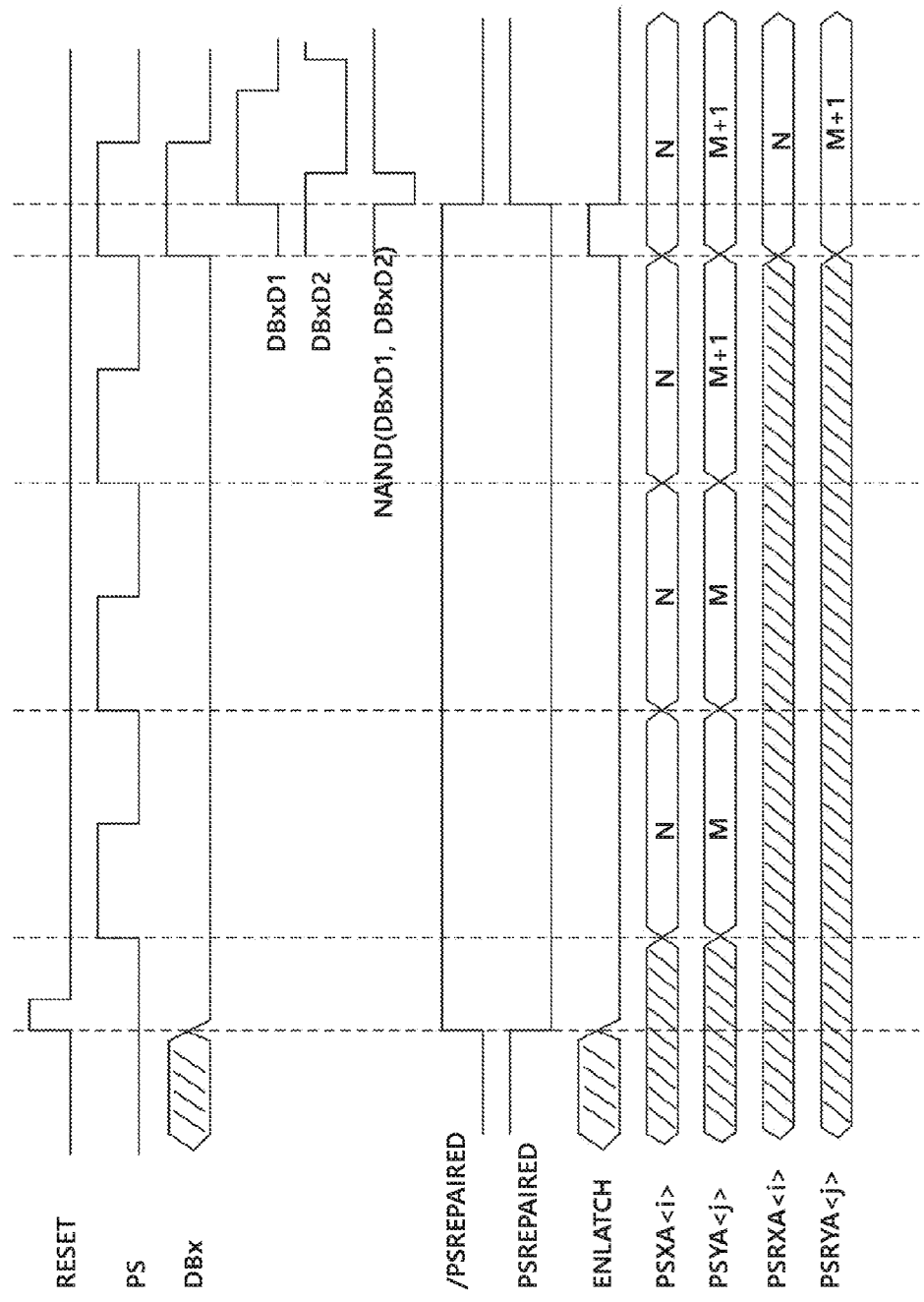
FIG. 12 is a timing diagram illustrating the operations of FIGS. 10 and 11.

Referring to FIG. 11, a diagram illustrating a circuit for controlling the address comparator of FIG. 10 is illustrated. In addition, referring to FIG. 12, a timing diagram illustrating the operations of FIGS. 10 and 11 is described. FIG. 12 also illustrates row address N and column addresses M and M+1.

First, an output of a NAND gate 401 is reset to a high level by a reset signal. Thus, the PS repair signal PSREPAIRED is reset to a low level. Then, the reset signal RESET transitions to a low level. FIG. 11 also illustrated repair signal /PSREPAIRED.

Then, when the bank fail signal DBx is activated to a high level from a low level by the PS operation, an output of a NAND gate 404 transitions to a low level, and the latch enable signal EN LATCH transitions to a high level.

A first delay unit 410 delays the bank fail signal DBx during a first delay time D1. Thus, an input DB×D1 of a NAND gate 403 transitions from a low level to a high level after the first delay time D1.

A second delay unit 420 delays an output of the first delay unit 410 during a second delay time D2, and inverts and outputs the delayed output. Thus, another input DB×D2 of the NAND gate 403 transitions from a high level to a low level after the first and second delay times D1 and D2.

Thus, the output of the NAND gate 403 maintains a low level only during the first delay time D1, and maintains a high level during the other periods.

The output of the NAND gate 403 maintains a high level after the output is reset. As the output of the NAND gate 403 transitions to a low level, the output of the NAND gate 402 transitions to a high level, and the output of the NAND gate 401 transitions to a low level.

As such, the latch enable signal ENLATCH is activated during the first delay time D1 after the bank fail signal DBx is activated. Further, the PS repair signal PSREPAIRED is activated when the first delay time D1 elapses after the bank fail signal DBx is activated.

The address comparator 300 of FIG. 10 may activate the PS repair signal PSREPAIRED to generate a comparison result between the latched address (PSRXA, PSRYA) to the write request address (EXTX, EXTY) after latching the PS address according to the latch enable signal ENLATCH thereby securing a margin for precise comparison.

The fail correction method for restoring the original data in the same cell when an intermittent fail occurred has been described.

The technical idea of the invention may be expanded to an embodiment which secures a separate memory area to dynamically repair a cell in which an intermittent fail occurred, when the intermittent fail occurred.

In an embodiment, a method for repairing a cell in which an intermittent fail occurred, using a redundancy cell for repairing the cell in which the intermittent fail occurred, may be considered.

At this time, a part of existing redundancy cells may be used as redundancy cells, and separate redundancy cells for an intermittent fail may be used as redundancy cells.

In an embodiment, an independent storage area such as SRAM may be formed to repair a cell in which an intermittent fail occurred.

In addition to such soft repair methods, a method for physically changing an address path for a cell in which an intermittent fail occurred, using an e-fuse which is electrically programmable, may also be considered. A fuse array may be configured to replace an access path for the cell in which the fail occurred with an access path for the redundancy cell, and a fuse controller may be configured to program the fuse array.

Figure 13:
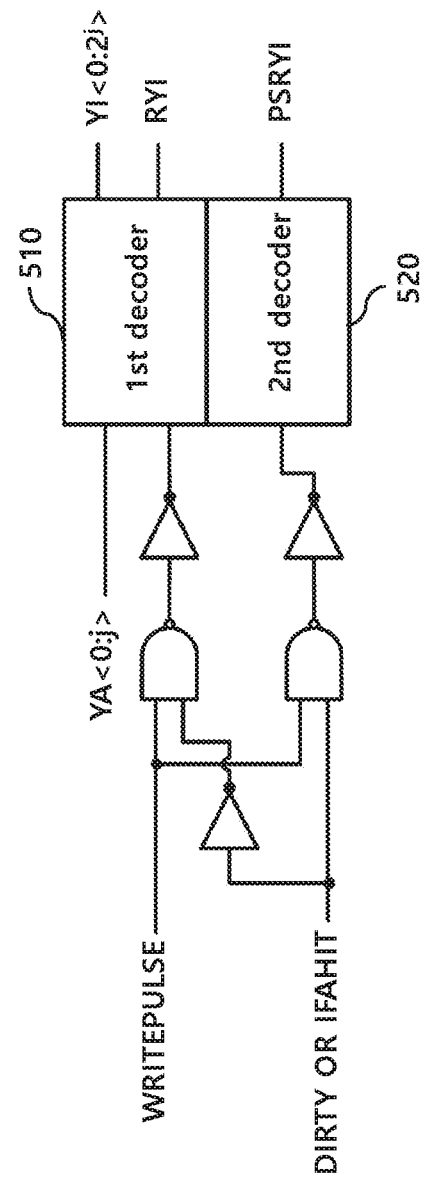
FIGS. 13 to 14 are diagrams illustrating a circuit for performing a repair operation in accordance with an embodiment of the invention.
Figure 14:
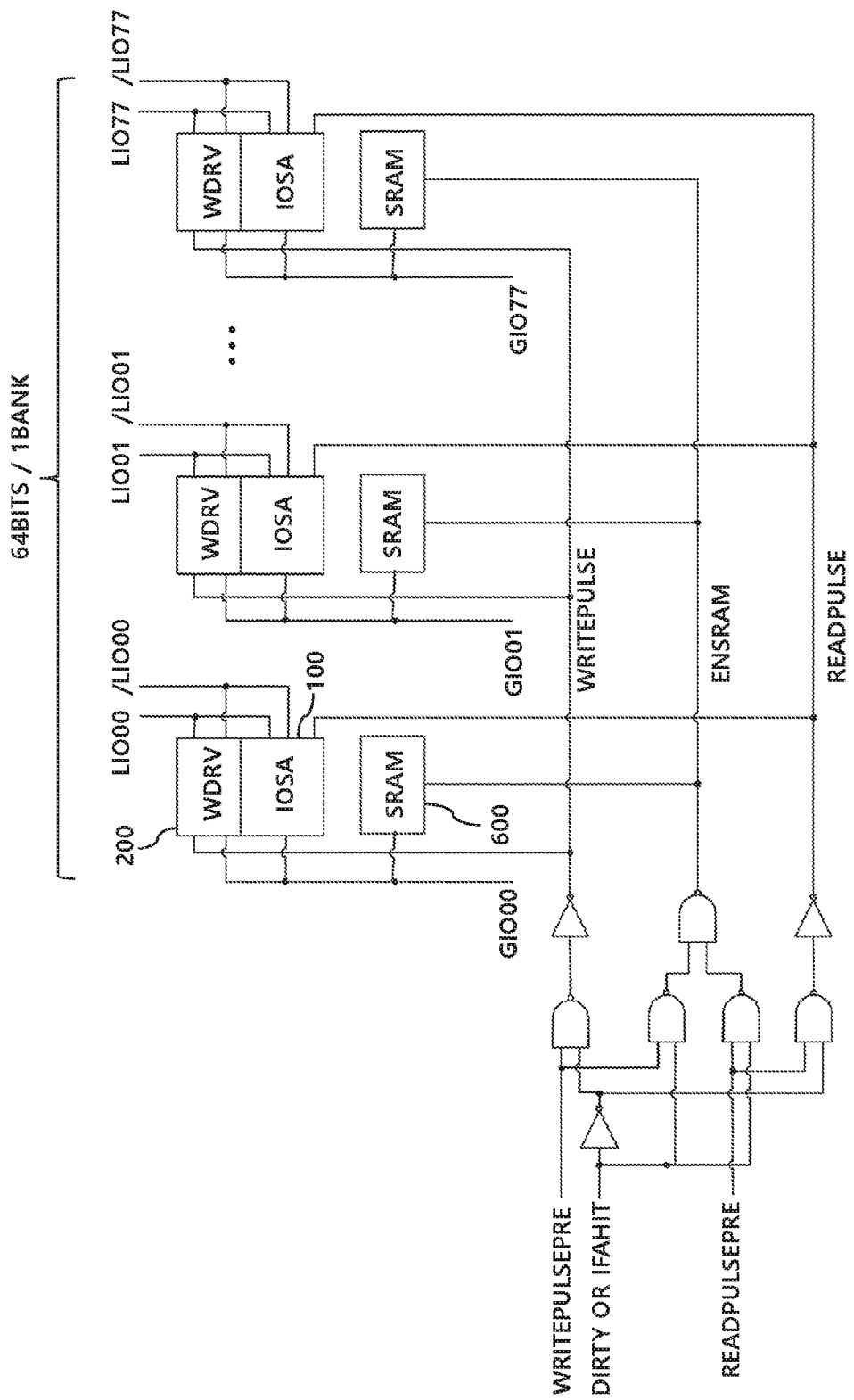

Referring to FIGS. 13 to 14, diagrams illustrating a circuit for performing a repair operation in accordance with an embodiment of the invention are described.

In FIGS. 13 and 14, a bit fail signal DIRTY indicates whether an intermittent fail was detected through the second PS operation. In addition, an intermittent fail address hit signal IFAHIT indicates whether a read or write request address coincides with an address at which an intermittent address occurred.

A first decoder 510 may perform a typical decoding operation when the read or write request address is different from the address at which the intermittent fail occurred according to an address of a normal cell according to the address comparator 300. The first decoder 510 provides a column select signal YI and a first redundancy column select signal RYI which is determined according to the existing redundancy technology.

A second decoder 520 may provide a second redundancy column select signal PSRYI through a PS operation in order to replace the cell in which the intermittent fail occurred, when the intermittent fail is detected and the read or write request address is equal to the address at which the intermittent fail occurred according to control of the address comparator 300.

The corresponding relation between the second redundancy column select signal and the address at which the intermittent fail occurred may be set in software manner by the second decoder 520, and physically fixed through an e-fuse.

FIG. 14 is a diagram illustrating an embodiment in which SRAM 600 is used to replace a cell in which an intermittent fail occurred. FIG. 14 also illustrates signals WRITEPULSEPRE, READPULSEPRE, and ENSRAM.

When a read or write request address does not coincide with an address at which an intermittent fail occurred, the IOSA 100 and the write driver 200 are used to write or read data to or from a cell.

When the read or write request address does not coincide with the address at which the intermittent fail occurred, the SRAM 600 is enabled instead of the corresponding cell, and a read or write operation is performed on the SRAM 600.

During the second PS operation, corrected data are stored in the SRAM 600 instead of the cell in which the intermittent fail was detected.

In an embodiment, the cell in which a fail was detected is repaired with the separate SRAM 600 through a PS operation.

The configuration in which the address of a cell in which a fail occurred is associated with the address of a redundancy cell or the configuration in which an input address is associated with any address of the SRAM 600 and a read or write operation is performed on the SRAM can be easily modified by those skilled in the art. Thus, the detailed descriptions thereof are omitted herein.

Figure 15:
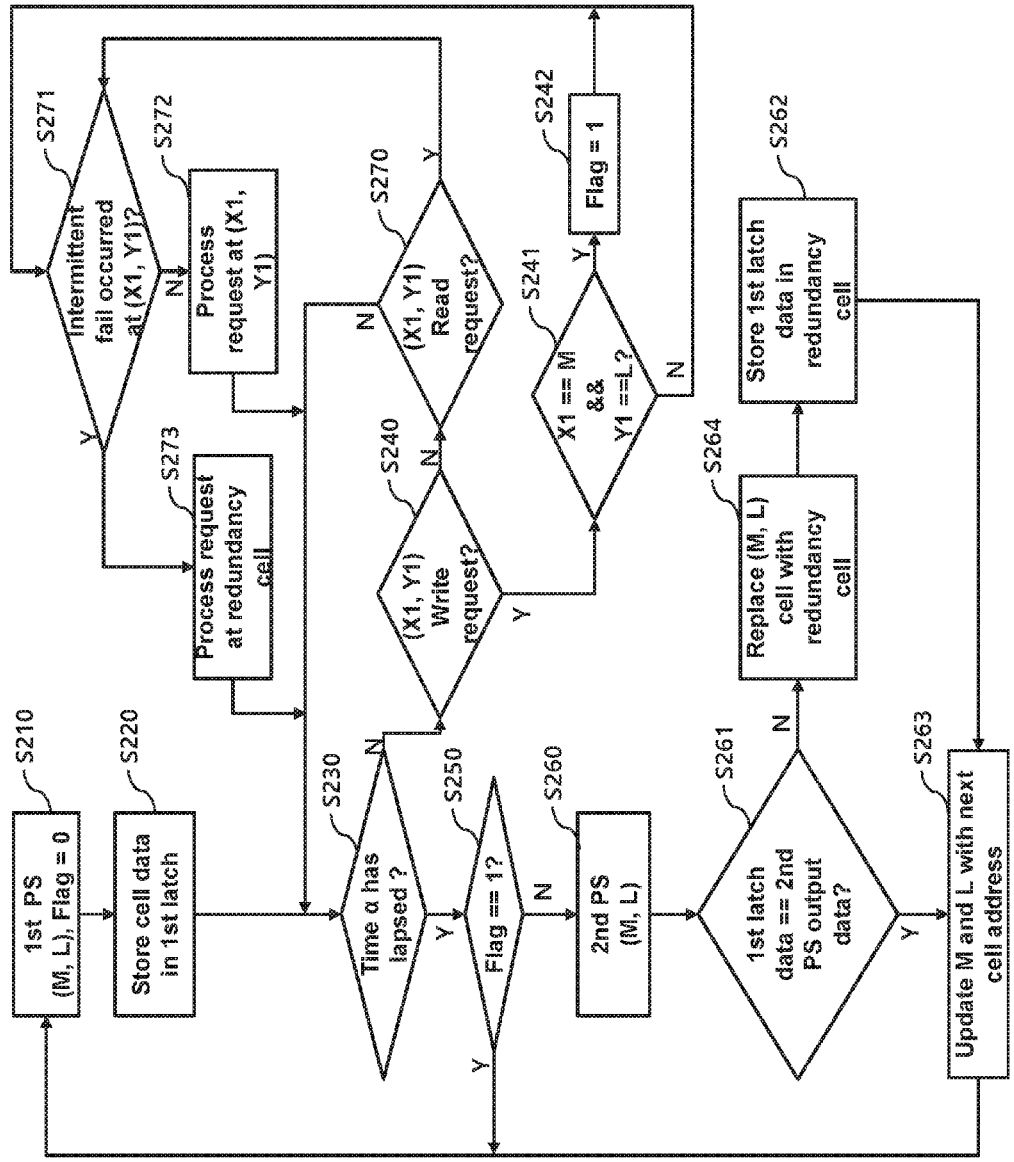
FIG. 15 is a flowchart illustrating the operation of the semiconductor device in accordance with an embodiment of the invention.

Referring to FIG. 15, a flowchart illustrating the operation of the semiconductor device described with reference to FIGS. 13 and 14 is described.

Hereafter, it may be assumed that a cell in which a PS operation is performed is a cell which has never experienced an intermittent fail before.

First, the semiconductor device starts the first PS operation on a cell of which the row address and column address are M and L, at step S210. At this time, a flag is set to zero.

The semiconductor device stores data read through the first PS operation in the first latch 10 at step S220.

Then, the semiconductor device determines whether a predetermined time α has elapsed, at step S230.

When it is determined that the predetermined time has elapsed, the semiconductor device determines whether the flag is 1, at step S250. The flag indicates whether a write request has been made for the same address as the address at which a PS operation is performed after the first PS operation.

When the flag is 1, the semiconductor device performs the first PS operation again on the corresponding cell at step S210, and when the flag is 0, the semiconductor device performs the second PS operation on the same cell at step S260.

Then, the semiconductor device determines whether data read through the second PS operation are equal to the data stored in the first latch 10 at step S261.

When the two data are different from each other, the semiconductor device determines that an intermittent fail occurred, and replaces the cell in which the PS operation was performed with a redundancy cell, at step S264. Then, the semiconductor device stores the data stored in the first latch 10 into the redundancy cell at step S262.

Then, the semiconductor device updates the row and column addresses M and L into the address of the next cell at which the PS operation is to be performed, at step S263, and performs the first PS operation on the next cell at step S210.

At steps S240 to S242, the semiconductor device determines whether a write request has been made for the cell in which the PS operation is performed before the second PS operation is performed after the first PS operation.

First, the semiconductor device determines whether a write request has been made at step S240.

When it is determined that a write request has been made, the semiconductor device determines whether the write request address (X1, Y1) is equal to the address (M, L) of the cell in which the PS operation is performed at step S241.

When it is determined that the write request address (X1, Y1) is equal to the address (M, L) of the cell in which the PS operation is performed, the flag is set to 1. Further when it is determined that the write request address (X1, Y1) is different from the address (M, L) of the cell in which the PS operation is performed, the flag is not changed. Then, the semiconductor device proceeds to step S271.

When it is determined at step S240 that no write request has been made, the semiconductor device determines whether a read request has been made at step S270.

When it is determined that no read request has been made, the semiconductor device proceeds to step S230. Further, when it is determined that a read request has been made, the semiconductor device proceeds to step S271.

At step S271, the semiconductor device determines whether an intermittent fail has ever occurred at the read or write request address (X1, Y1). At step 272, the request is processed.

When it is determined that an intermittent fail has occurred at the read or write request address, it may indicate that the corresponding cell has been replaced with a redundancy cell. Thus, the semiconductor device processes the read or write request on the redundancy cell at step S273. When it is determined that an intermittent fail has never occurred at the request address, the semiconductor device processes a read or write request on the read or write request cell.

Then, the semiconductor device proceeds to step S230, and repeats the above-described steps.

In the above-described embodiment, it is assumed that the cell (M, L) in which PS is performed is a cell which has never experienced an intermittent fail.

However, those skilled in the art can apply the technical idea of the invention to the case in which the cell (M, L) in which PS is performed is a cell which has ever experienced an intermittent fail.

Figure 16:
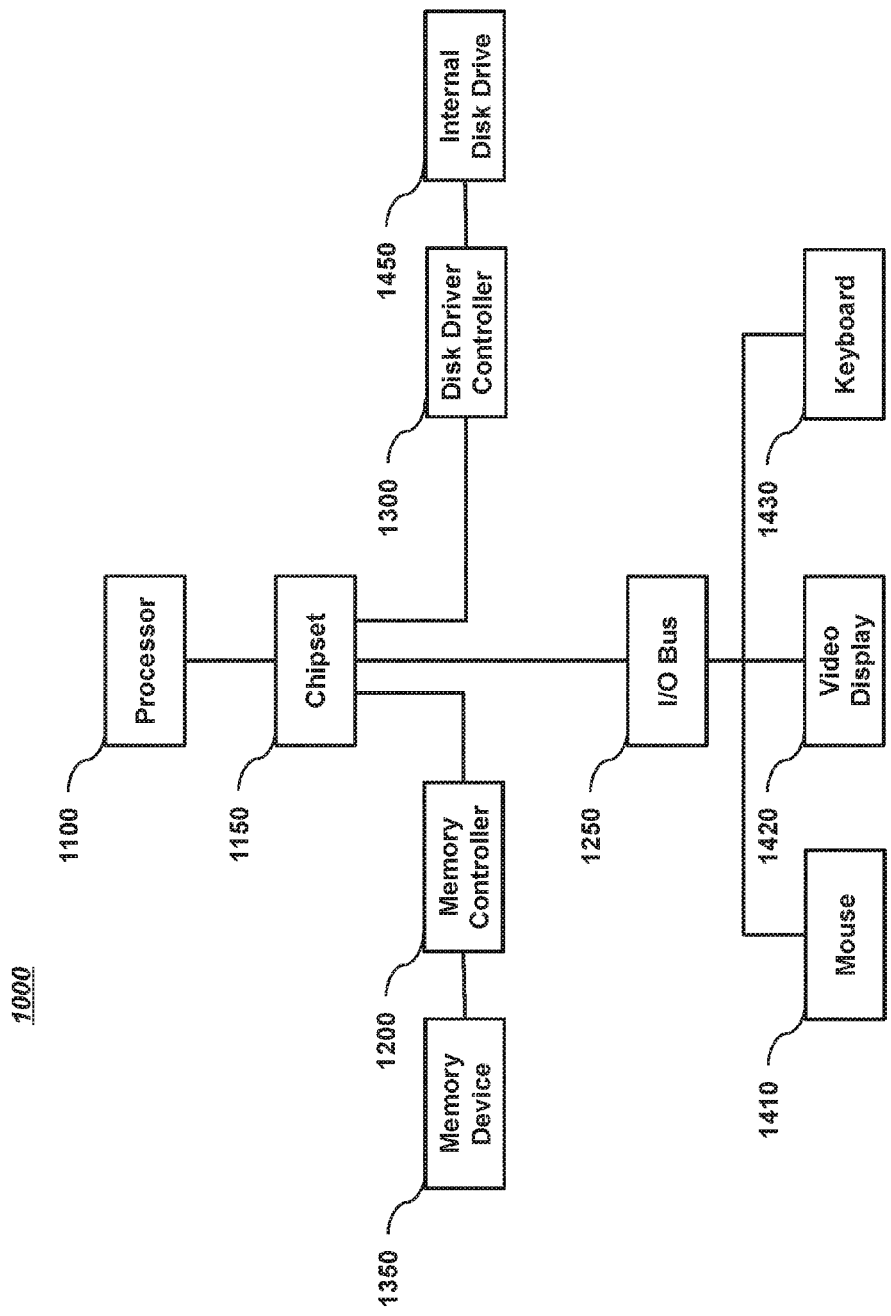
FIG. 16 illustrates a block diagram of a system according to an embodiment of the invention.

Referring to FIG. 16, a system 1000 may include one or more processors 1100. The processor 1100 may be used individually or in combination with other processors. A chipset 1150 may be electrically coupled to the processor 1100. The chipset 1150 is a communication pathway for signals between the processor 1100 and other components of the system 1000. Other components may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be electrically coupled to the chipset 1150. The memory controller 1200 can receive a request provided from the processor 1100 through the chipset 1150. The memory controller 1200 may be electrically coupled to one or more memory devices 1350. The memory devices 1350 may include the semiconductor device described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420 or a keyboard 1430. The I/O bus 1250 may employ any one of a number of communications protocols to communicate with the I/O devices 1410, 1420 and 1430.

The disk drive controller 1300 may also be electrically coupled to the chipset 1150. The disk drive controller 1300 may serve as the communication pathway between the chipset 1150 and one or more internal disk drives 1450. The disk drive controller 1300 and the internal disk drives 1450 may communicate with each other or with the chipset 1150 using virtually any type of communication protocol.

In this case, those skilled in the art can apply the technical idea of the invention to the case in which the semiconductor device determines whether an intermittent fail also occurred in a redundancy cell which replaced the cell in which the intermittent fail occurred, and repairs the redundancy cell with another redundancy cell.

In accordance with embodiments of the invention, the semiconductor device can detect and correct an intermittent fail during operation of a memory cell, and improve reliability.

Furthermore, the semiconductor device can repair a cell in which an intermittent fail occurred during operation of a memory cell, through a software method, thereby improving the reliability of the memory cell.

Furthermore, the semiconductor device can repair a cell in which an intermittent fail occurred during operation of a memory cell, using a redundancy cell, thereby improving the reliability of the memory cell.

Furthermore, the semiconductor device can repair a cell in which an intermittent fail occurred during operation of a memory cell, through a hard repair method, thereby improving the reliability of the memory cell.

Although various embodiments have been described for illustrative purposes, it will be apparent to those skilled in the art that various changes and modifications may be made without departing from the spirit and scope of the invention as defined in the following claims.

What is claimed is:

1. A semiconductor device comprising:
   a first latch configured to store data outputted from a memory cell during a first operation; and
   a fail detection circuit configured to detect a fail by comparing the data stored in the first latch by the first operation with data outputted from the memory cell by a second operation performed after the first operation.

2. The semiconductor device of claim 1, further comprising:
   an amplifier configured to amplify the data outputted from the memory cell;
   a first driving circuit configured to drive the first latch; and
   a first driving control circuit configured to control the first driving circuit to store an output of the amplifier in the first latch during the first operation.

3. The semiconductor device of claim 2, further comprising:
   a second latch;
   a second driving circuit configured to drive the second latch; and
   a second driving control circuit configured to control the second driving circuit to store the output of the amplifier in the second latch when the first operation is not performed.

4. The semiconductor device of claim 1, further comprising a write driver configured to store the data stored in the first latch into the memory cell when the fail is detected in the memory cell.

5. The semiconductor device of claim 4, wherein the write driver comprises:
   a signal selection circuit configured to select the output of the first latch when the fail is detected;
   a third driving circuit configured to generate a signal to provide to the memory cell; and
   a third driving control circuit configured to control the third driving circuit according to the signal selected by the signal selection circuit.

6. The semiconductor device of claim 1, further comprising: an address comparator configured to determine whether a write request address coincides with an address of the memory cell, when a write request is made between the first and second operations.

7. The semiconductor device of claim 6, wherein when an output of the address comparator is activated, the first operation is performed again on the memory cell.

8. The semiconductor device of claim 6, wherein the address comparator comprises:
   an address latch circuit configured to latch the address of the memory cell; and
   a determination circuit configured to perform an operation on an output of the address latch circuit and the write request address, and determine whether the output of the address latch circuit is equal to the write request address.

9. The semiconductor device of claim 8, wherein the address latch circuit latches the address of the memory cell during a time after the fail is detected, and the determination circuit generates a determination result after the time after the fail is detected.

10. The semiconductor device of claim 1, further comprising:
    a repair circuit configured to replace an address of the memory cell with an address of a redundancy cell when the fail is detected in the memory cell; and
    a write driver configured to store the data stored in the first latch into the redundancy cell.

11. The semiconductor device of claim 10, wherein the redundancy cell comprises a same type of cell as the memory cell or a Static Random-Access Memory (SRAM) cell.

12. The semiconductor device of claim 10, wherein the repair circuit comprises:
    an address comparator configured to determine whether a read or write request address is the cell in which the fail is detected;
    a first decoder configured to decode the read or write request address to an address of a normal cell according to an address comparator; and
    a second decoder configured to decode the read or write request address to the address of the redundancy cell according to control of the address comparator.

13. The semiconductor device of claim 10, wherein the repair circuit comprises:
- a fuse array configured to replace an access path for the cell in which the fail occurred with an access path for the redundancy cell; and
- a fuse controller configured to program the fuse array.

14. An operating method of a semiconductor device, comprising:
- a first step of performing a first operation to latch first data outputted from a memory cell; and
- a second step of performing a second operation when a predetermined time elapses after the first operation, and detecting a fail by comparing second data outputted from the memory cell to the first data.

15. The operating method of claim 14, further comprising:
- a third step of storing the first data in the memory cell when the fail is detected at the second step.

16. The operating method of claim 14, further comprising:
- determining whether a write operation is performed on the memory cell before the second operation and after the first operation; and
- performing the first operation again before the second operation when the write operation is performed.

17. The operating method of claim 14, further comprising:
- replacing the memory cell with a redundancy cell when the fail is detected at the second step; and
- storing the first data in the redundancy cell.

18. The operating method of claim 17, wherein the replacing of the memory cell with the redundancy cell comprises converting an address of the memory cell into an address of the redundancy cell.

19. The operating method of claim 17, wherein the replacing of the memory cell with the redundancy cell comprises programming a fuse array to set an access path for the memory cell to an access path for the redundancy cell.

20. The operating method of claim 17, further comprising:
- processing a read or write request for the redundancy cell, when the read or write request is inputted for the memory cell in which the fail is detected.

* * * * *